(12) United States Patent
Wang et al.

(10) Patent No.: US 12,375,066 B1
(45) Date of Patent: Jul. 29, 2025

(54) MATRIX DECOMPOSITION STRUCTURE OF TWO-CHANNEL QUADRATURE MIRROR FILTER BANK AND COEFFICIENT DESIGN METHOD THEREOF

(71) Applicant: Hangzhou Dianzi University, Hangzhoiu (CN)

(72) Inventors: Hao Wang, Hangzhoiu (CN); Shi Li, Hangzhoiu (CN); Xiuyun Du, Hangzhoiu (CN); Pengkai Ma, Hangzhoiu (CN); Hanqi Wang, Hangzhoiu (CN)

(73) Assignee: Hangzhou Dianzi University, Hangzhou (CN)

( * ) Notice: Subject to any disclaimer, the term of this patent is extended or adjusted under 35 U.S.C. 154(b) by 0 days.

(21) Appl. No.: 19/028,818

(22) Filed: Jan. 17, 2025

(30) Foreign Application Priority Data

Aug. 9, 2024 (CN) .......................... 202411088534.4

(51) Int. Cl.
*H03H 17/02* (2006.01)
*G06F 17/16* (2006.01)

(52) U.S. Cl.
CPC ......... *H03H 17/0272* (2013.01); *G06F 17/16* (2013.01); *H03H 17/0266* (2013.01)

(58) Field of Classification Search
CPC .... H03H 17/0266; H03H 17/027–0273; G06F 17/16
See application file for complete search history.

(56) References Cited

U.S. PATENT DOCUMENTS

| | | | | |
|---|---|---|---|---|
| 4,815,023 A | * | 3/1989 | Arbeiter | H03H 17/0272 708/301 |
| 5,436,940 A | * | 7/1995 | Nguyen | H04B 1/667 375/240 |
| 2003/0005007 A1 | | 1/2003 | Neretti et al. | |

FOREIGN PATENT DOCUMENTS

| | | | | |
|---|---|---|---|---|
| CN | 107565932 A | | 1/2018 | |
| CN | 110365312 A | * | 10/2019 | ......... H03H 17/0009 |
| CN | 110365312 B | * | 4/2020 | ......... H03H 17/0009 |
| CN | 115314025 A | | 11/2022 | |
| CN | 117040483 A | | 11/2023 | |
| CN | 118590031 A | * | 9/2024 | |

(Continued)

OTHER PUBLICATIONS

Chen Huali et al., Novel Design of Perfect Reconstructed Quadrature Mirror II R Filter Banks, Co mputer Science, 08, Aug. 15, 2009, Full Text.

(Continued)

*Primary Examiner* — Matthew D Sandifer (57) ABSTRACT

A matrix decomposition structure of a two-channel quadrature mirror filter bank, including an analysis filter part, a synthesis filter part, the filter part includes an $E_{0,M}$ module, an X module, a Y module, a Z module, an input port and an output port. The X module takes a value of the input port as an input of a multiplier, and the $E_{0,M}$ module delays the input. An output of the X module passes through the Y module and then is used as an input of the Z module, and outputs of the Z module and the $E_{0,M}$ module are added and then output from the output port, and pass through a middle part to enter the synthesis filter part.

9 Claims, 7 Drawing Sheets

(56) References Cited

FOREIGN PATENT DOCUMENTS

EP      1216557 B1    6/2009
WO   2017075868 A1    5/2017

OTHER PUBLICATIONS

Zhou Yuren et al., Factorization of Filter Banks Through Lifting Scheme, Acta Electronica Sinica, 10, Oct. 25, 2003, Full Text.
Wang Hao et al,, Matrix, Decomposition Based Low-Complexity FIR Filter: Further Results, IEEE, Jan. 1, 2020, Full Text.
Huali Chen et al.,"Novel Design of Perfect Reconstructed Quadrature Mrror II R Filter Banks", Computer Science, vol. 36, No. 8, Aug. 15, 2009, pp. 92-115.
Yuren Zhou et al., "Factorization of Filter Banks Through Lifting Scheme", Acta Electronica Sinica, vol. 31, No. 10, Oct. 25, 2003, pp. 1584-1586.
Wang Hao et al., "Matrix Decomposition Based Low-Complexity FIR Filter: Further Results", IEEE, vol. 67, No. 2, Jan. 1, 2020, pp. 1-14.

* cited by examiner

MATRIX DECOMPOSITION STRUCTURE OF TWO-CHANNEL QUADRATURE MIRROR FILTER BANK AND COEFFICIENT DESIGN METHOD THEREOF

TECHNICAL FIELD

The present invention belongs to the technical field of digital signal processing, and particularly relates to a matrix decomposition structure of a two-channel quadrature mirror filter bank and a coefficient design method thereof.

BACKGROUND OF THE PRESENT INVENTION

Two-channel quadrature mirror filter bank (2c-QMFB) is one of digital filter banks found and used at the earliest, which can meet a non-aliasing condition of signal reconstruction, and is widely used in spectrum analysis, audio and video decoding, adaptive filtering, medical signal processing and other fields. An analysis filter part in the 2c-QMFB may decompose a signal to be processed into two groups of sub-band signals, the sub-band signals are processed respectively according to processing requirements, which reduces the complexity of data processing and operation, and then the processed signals are reconstructed through a rear synthesis filter part to restore the original signal.

When there is a high requirement for a frequency domain performance of the filter bank, FIR filters in the analysis filter part and the synthesis filter part in the 2c-QMFB often need a very high order, which will consume a lot of hardware resources in hardware implementation at this time. Therefore, how to reduce the hardware resource consumption of the entire 2c-QMFB without affecting the frequency domain performance of the filter bank has a very high research value.

SUMMARY OF THE PRESENT INVENTION

Aiming at the defects in the prior art, the present invention provides a matrix decomposition structure of a two-channel quadrature mirror filter bank and a coefficient design method thereof, and on the basis of an efficient polyphase structure of the two-channel quadrature mirror filter bank based on time division multiplexing, an analysis filter part and a synthesis filter part are subjected to matrix decomposition, so as to reduce numbers of multipliers and adders required for hardware implementation.

A matrix decomposition structure of a two-channel quadrature mirror filter bank comprises an analysis filter part, a synthesis filter part and a connecting part.

The analysis filter part comprises one $E_{0,M}$ module, D X modules, one Y module, D Z modules, one total input port Input, and two total output ports Output0 and Output1, and the analysis filter part and the synthesis filter part have a same structure.

Each X module is a multiplier multiplexing unit, and a $d^{th}$ X module $X_d$ comprises p multipliers, $2 \cdot (p-1)$ adders and $2 \cdot (p-1)$ delayers with a delay of t, wherein $t=2 \cdot T$, and T is a system clock period, $d=1, 2, \ldots D$. Input ports of the p multipliers are directly connected with the total input port Input. At the moment 0, an output of a $p^{th}$ multiplier $x_{d,p}$ is subjected to 1 delay t, and then added with an output of a $(p-1)^{th}$ multiplier $x_{d,p-1}$, then a calculation result is subjected to 1 delay t, and then added with an output of a $(p-2)^{th}$ multiplier $x_{d,p-2}$, and so on, so that the output of the $p^{th}$ multiplier $x_{d,p}$ is delayed and added for $p-1$ times to obtain an output $I_{d,0}$ of the $X_d$; and at the moment 1, an output of a $1^{st}$ multiplier $x_{d,1}$ is delayed and added for $p-1$ times to obtain an output $I_{d,1}$ of the $X_d$.

The $E_{0,M}$ module is a retention coefficient module; and comprises 1 delayer with a delay of T1, M multipliers, $2 \cdot (M-1)$ adders and $2 \cdot (M-1)$ delayers with a delay of t, wherein $$T1 = \frac{N - 2 \cdot M}{2} T,$$

and N represents a number of coefficients of a low-pass filter in the analysis filter part. The total input port Input passes through the delayer with the delay of T1 and then is input into the M multipliers $h_m$. At the moment 0, an output of an $M^{th}$ multiplier $h_M$ is delayed and added for $M-1$ times to obtain an output $O_0$ of the $E_{0,M}$ module; and at the moment 1, an output of a $1^{st}$ multiplier $h_1$ is delayed and added for $M-1$ times to obtain an output $O_1$ of the $E_{0,M}$ module.

The Y module is a mixed multiplication-addition module, and comprises $D^2$ multipliers and D adders. At the moment 0, a multiplier $y_{d,1}$ to a multiplier $y_{d,D}$ are connected with an output port $I_{d,0}$ of the $d^{th}$ X module $X_d$, and at the moment 1, the multiplier $y_{d,1}$ to the multiplier $y_{d,D}$ are connected with an output port $I_{d,1}$ of the $d^{th}$ X module $X_d$. Outputs of a multiplier $y_{1,d}$ to a multiplier $y_{D,d}$ pass through one adder, and then are used a $d^{th}$ output $J_d$ of the Y module.

Each Z module has a similar structure to that of the X module, and comprises q multipliers, $2 \cdot (q-1)$ adders, and $2 \cdot (q-2)$ delayers with a delay of t1 and 1 delayer with a delay of t2, wherein $t1=p \cdot t$, and $t2=M \cdot t+t1$. In a $d^{th}$ Z module $Z_d$, input ports of the q multipliers are all connected with the $d^{th}$ output $J_d$ of the Y module. At the moment 0, an output of a $q^{th}$ multiplier $Z_{d,q}$ is delayed and added for $q-1$ times to obtain an output $K_{d,0}$ of the $Z_d$, wherein a delay of an $n^{th}$ delayer is t2, and delays of the remaining delayers are all t1, wherein n satisfies $$\frac{N - 2 \cdot M}{4} = p \cdot n \text{ and } \frac{N}{2} = p \cdot q + M;$$

and at the moment 1, an output of a $1^{st}$ multiplier $z_{d,1}$ is delayed and added for $q-1$ times to obtain an output $K_{d,1}$ of the $Z_d$, wherein the delay of the $n^{th}$ delayer is t2, and the delays of the remaining delayers are all t1.

At the moment 0, the Output1 remains unchanged, and outputs $K_{1,0}, K_{2,0} \ldots K_{D,0}$ of the D Z modules are added with the output $O_0$ of the $E_{0,M}$ module, and output from the total output port Output0 of the analysis filter part; and at the moment 1, the Output0 remains unchanged, and outputs $K_{1,1}, K_{2,1} \ldots K_{D,1}$ of the D Z modules are added with the output $O_1$ of the $E_{0,M}$ module, and output from the total output port Output1 of the analysis filter part.

The connecting part adds and subtracts the Output0 and the Output1 output by the analysis filter part respectively at the moment 0, and at the moment 0, a subtraction result is subtracted from an addition result to input into the synthesis filter part; and at the moment 1, the addition result is added with the subtraction result to input into the synthesis filter part. calculations at the moment 0 and the moment 1 are carried out continuously alternately.

A coefficient design method of a matrix decomposition structure of a two-channel quadrature mirror filter bank comprises specific steps as follows:

first step: determining an order N and a stopband cutoff frequency $\omega_s$ of a low-pass analysis filter in the two-channel quadrature mirror filter bank;

second step: obtaining an original coefficient $H_0=[h_0(0), h_0(1), \ldots, h_0(N-1)]$ of the low-pass analysis filter according to design parameters, and then obtaining an odd term coefficient $E_0=[e_0(0), e_0(1), \ldots, e_0(N/2-1)]=[h_0(0), h_0(2), \ldots, h_0(N-2)]$;

third step: expressing $E_0$ as a coefficient matrix E of p×q and a retention coefficient vector $E_{0,M}$ with a length of M:

$$E = \begin{bmatrix} e_0(0) & \cdots & e_0((n-1)p) & e_0(n \cdot p + M) & \cdots & e_0((q-1)p+M) \\ e_1(1) & \cdots & e_0((n-1)p+1) & e_0(n \cdot p + M + 1) & \cdots & e_0((q-1)p+M+1) \\ \vdots & & \vdots & \vdots & & \vdots \\ e_0(p-1) & \cdots & e_0((n-1)p+p-1) & e_0(n \cdot p + M + p - 1) & \cdots & e_0((q-1)p+M+p-1) \end{bmatrix}; \quad (1)$$

$$E_{0,M} = [e_0(n \cdot p), e_0(n \cdot p + 1), \ldots, e_0(n \cdot p + M - 1)]; \quad (2)$$

fourth step: carrying out SVD decomposition on the coefficient matrix E to obtain matrices U, S and V, wherein the coefficient matrix E is equivalent to a product of the matrix U, the matrix S and the matrix $V^T$, wherein S is a main diagonal matrix, and $E=USV^T$;

$$U = [X_1 \; X_2 \; \cdots \; X_p] = \begin{bmatrix} x_{1,1} & x_{2,1} & \cdots & x_{p,1} \\ x_{1,2} & x_{2,2} & \cdots & x_{p,2} \\ \cdots \\ x_{1,p} & x_{2,p} & \cdots & x_{p,p} \end{bmatrix}; \quad (3)$$

$$S = [Y_1 \; Y_2 \; \cdots \; Y_p]^T = \begin{bmatrix} y_{1,1} & 0 & \cdots & 0 \\ 0 & y_{2,2} & \cdots & 0 \\ \cdots \\ 0 & 0 & \cdots & y_{p,q} \end{bmatrix}; \quad (4)$$

$$V = [Z_1 \; Z_2 \; \cdots \; Z_q] = \begin{bmatrix} z_{1,1} & z_{2,1} & \cdots & z_{q,1} \\ z_{1,2} & z_{2,2} & \cdots & z_{q,2} \\ \cdots \\ z_{1,q} & z_{2,q} & \cdots & z_{q,q} \end{bmatrix}; \quad (5)$$

fifth step: taking the first Dcolumns of U1 of the matrix U, a D×D part S1 of an upper left corner of the matrix S and the first D columns of V1 of the matrix V to calculate an equivalent coefficient matrix E' of an original coefficient matrix; and $$E' = U1 \cdot S1 \cdot V1^T; \quad (6)$$

sixth step: according to the retention coefficient vector $E_{0,M}$ obtained in the second step and the decomposition coefficient matrices U1, S1 and V1 obtained in the fifth step, taking elements in the vector $E_{0,M}$ as coefficients of the M multipliers in the $E_{0,M}$ module; taking a $d^{th}$ column of elements in the matrix U1 as coefficients of the multipliers of the $d^{th}$ X module; taking elements on a diagonal line in the matrix S1 as coefficients of a multiplier $y_{1,1}$, a multiplier $y_{2,2}$, ..., a multiplier $y_{D,D}$ in the Y module, and setting Coefficients of the remaining multipliers to be 0; and taking a $d^{th}$ column of elements in the matrix V1 as coefficients of the multipliers of the $d^{th}$ z module.

The present invention has the beneficial effects as follows.

On the basis of the efficient polyphase structure based on time division multiplexing, the coefficients are arranged into appropriate matrix and vector forms according to the design requirements, then the coefficient matrix is decomposed by an SVD function, and appropriate rows and columns are selected from the decomposition matrix to be equivalent to the original coefficient matrix. This method effectively reduces the number of multipliers and adders in the filter bank, and reduces the resource consumption of the two-channel quadrature mirror filter bank in hardware implementation; and meanwhile, the effectiveness of the filter bank in frequency domain performance and signal reconstruction performance is guaranteed.

DETAILED DESCRIPTION OF PREFERRED EMBODIMENTS

The present invention is further described hereinafter with reference to the drawings.

Figure 1:
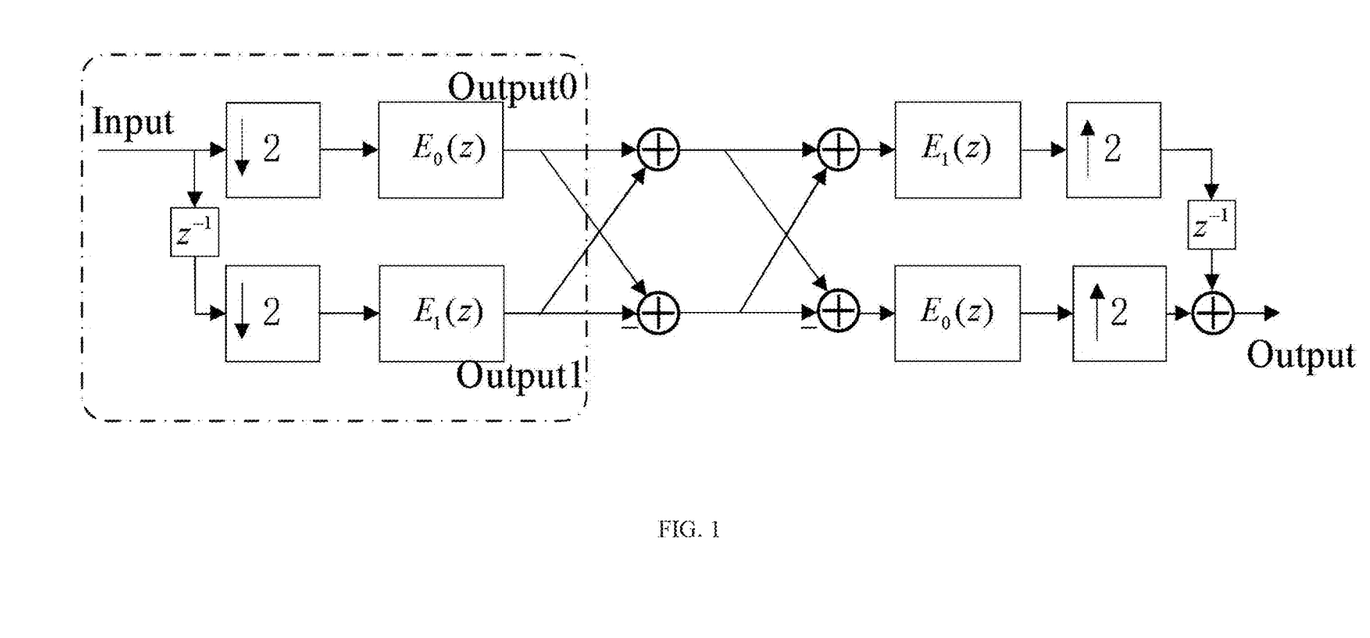
FIG. 1 is a system block diagram of an efficient polyphase structure of a two-channel quadrature mirror filter bank.
Figure 2:
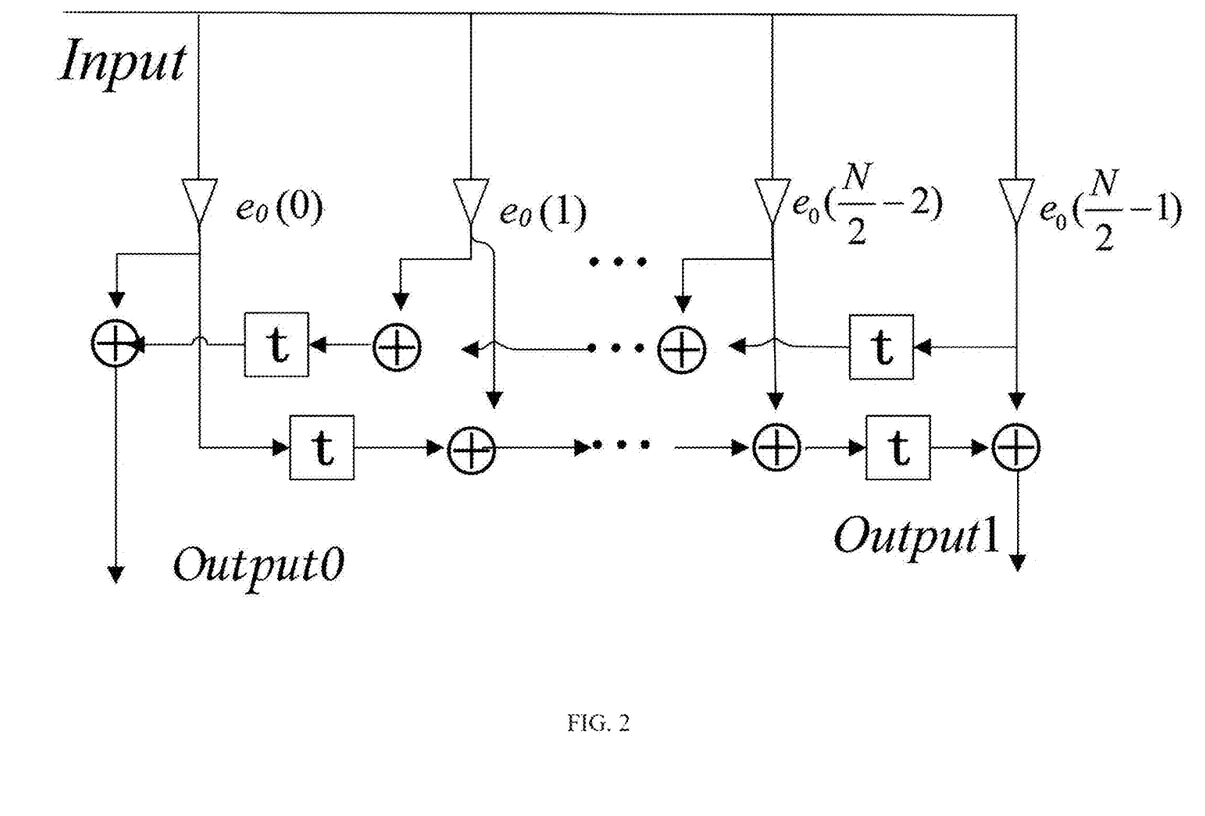
FIG. 2 is a schematic diagram of an analysis filter part in the efficient polyphase structure based on time division multiplexing.

As shown in FIG. 1, an efficient polyphase structure of a two-channel quadrature mirror filter bank comprises an analysis filter part, a connecting part consisting of 4 adders, a synthesis filter part, and a total input port Input and a total output port Output. In the analysis filter part and the synthesis filter part, coefficients in an $E_1(z)$ module are in a reversed sequence of coefficients in an $E_0(z)$ module. According to this relationship, the efficient polyphase structure can be realized by time division multiplexing, so as to reduce multiplier consumption by half. As shown in FIG. 2, the analysis filter part in the efficient polyphase structure based on time division multiplexing comprises N/2 multipliers, $$2 \cdot \left(\frac{N}{2} - 1\right)$$

adders and $$2 \cdot \left(\frac{N}{2} - 1\right)$$

delayers with a delay of t, wherein t=2·T, and T is a system clock period. Input ports of the N/2 multipliers are directly connected with the total input port Input. At a moment 0, an output of a $$\left(\frac{N}{2}\right)^{th}$$

multiplier $$e_0\left(\frac{N}{2} - 1\right)$$

is subjected to 1 delay t, and then added with an output of a $$\left(\frac{N}{2} - 1\right)^{th}$$

multiplier $$e_0\left(\frac{N}{2} - 2\right),$$

then a calculation result is subjected to 1 delay t, and then added with an output of a $$\left(\frac{N}{2} - 2\right)^{th}$$

multiplier $$e_0\left(\frac{N}{2} - 3\right),$$

and so on, so that the output of the $$\left(\frac{N}{2}\right)^{th}$$

multiplier $$e_0\left(\frac{N}{2} - 1\right)$$

is delayed and added for $$\frac{N}{2} - 1$$

times to obtain an output Output0 of the analysis filter part; and at a moment 1, an output of a $1^{st}$ multiplier $e_0(0)$ is delayed and added for $$\frac{N}{2} - 1$$

times to obtain an output Output1 of the analysis filter part.

On the basis of the efficient polyphase structure of the two-channel quadrature mirror filter bank based on time division multiplexing, structures of the analysis filter part and the synthesis filter part are subjected to matrix decomposition in the present application. The analysis filter part comprises one $E_{0,M}$ module, D X modules, one Y module, D Z modules, one total input port Input, and two total output ports Output0 and Output1.

Figure 3:
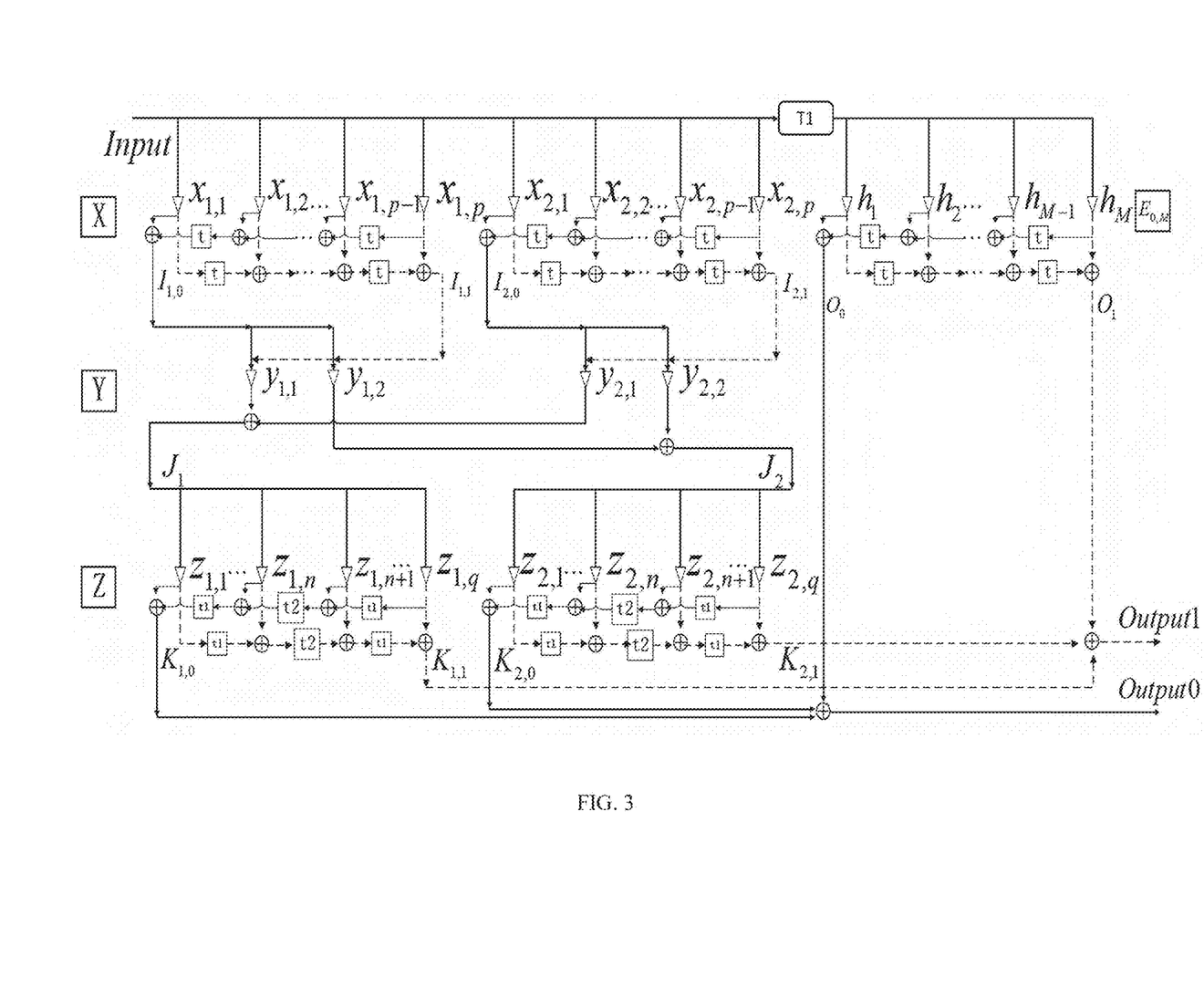
FIG. 3 is a schematic diagram of a matrix decomposition structure of the two-channel quadrature mirror filter bank when D=2 in an embodiment.

Taking D=2 as an example, the structure of the analysis filter part is as shown in FIG. 3. Each X module is a multiplier multiplexing unit, and a $d^{th}$ X module $X_d$ comprises p multipliers, 2·(p−1) adders and 2·(p−1) delayers with a delay of t, wherein d=1,2. Input ports of the p multipliers are directly connected with the total input port Input. At the moment 0, an output of a $p^{th}$ multiplier $x_{d,p}$ is subjected to 1 delay t, and then added with an output of a $(p-1)^{th}$ multiplier $X_{d,p-1}$, then a calculation result is subjected to 1 delay t, and then added with an output of a $(p-2)^{th}$ multiplier $x_{d,p-2}$, and so on, so that the output of the $p^{th}$ multiplier $x_{d,p}$ is delayed and added for p−1 times to obtain an output $I_{d,0}$ of the $X_d$; and at the moment 1, an output of a $1^{st}$ multiplier $x_{d,1}$ is delayed and added for p−1 times to obtain an output $I_{d,1}$ of the $X_d$.

The $E_{0,M}$ module is a retention coefficient module; and comprises 1 delayer with a delay of T1, M multipliers, 2·(M−1) adders and 2·(M−1) delayers with a delay of $$T1 = \frac{N - 2 \cdot M}{2} T,$$

and N represents a number of coefficients of a low-pass filter in the analysis filter part. The total input port Input passes through the delayer with the delay of T1 and then is input into the M multipliers $h_m$. At the moment 0, an output of an $M^{th}$ multiplier $h_M$ is delayed and added for M−1 times to obtain an output $O_0$ of the $E_{0,M}$ module; and at the moment 1, an output of a $1^{st}$ multiplier $h_1$ is delayed and added for M−1 times to obtain an output $O_1$ of the $E_{0,M}$ module.

The Y module is a mixed multiplication-addition module, and comprises 4 multipliers and 2 adders. At the moment 0, a multiplier $y_{d,1}$ to a multiplier $y_{d,2}$ are connected with an output port $I_{d,0}$ of the $d^{th}$ X module $X_d$, and at the moment 1, the multiplier $y_{d,1}$ to the multiplier $y_{d,2}$ are connected with an output port $I_{d,1}$ of the $d^{th}$ X module $X_d$. Outputs of a multiplier $y_{1,d}$ to a multiplier $y_{2,d}$ pass through one adder, and then are used a $d^{th}$ output $J_d$ of the Y module.

Each Z module has a similar structure as that of the X module, and comprises q multipliers, 2·(q−1) adders, and 2·(q−2) delayers with a delay of t1 and 1 delayer with a delay of t2, wherein t1=p·t, and t2=M·t+t1. In a $d^{th}$ Z module $Z_d$, input ports of the q multipliers are all connected with a $d^{th}$ output $J_d$ of the Y module. At the moment 0, an output of a $q^{th}$ multiplier $z_{d,q}$ is delayed and added for q−1 times to obtain an output $K_{d,0}$ of the $Z_d$, wherein a delay of an $n^{th}$ delayer is t2, and delays of the remaining delayers are all t1, wherein n satisfies $$\frac{N-2\cdot M}{4} = p\cdot n \text{ and } \frac{N}{2} = p\cdot q + M;$$

and at the moment 1, an output of a $1^{st}$ multiplier $z_{d,1}$ is delayed and added for q−1 times to obtain an output $K_{d,1}$ of the $Z_d$, wherein the delay of the $n^{th}$ delayer is t2, and the delays of the remaining delayers are all t1.

At the moment 0, outputs $K_{1,0}$ and $K_{2,0}$ of the 2 Z modules are added with the output $O_0$ of the $E_{0,M}$ module to obtain the total output port Output0 of the analysis filter part; and at the moment 1, outputs $K_{1,1}$ and $K_{2,1}$ of the 2 Z modules are added with the output $O_1$ of the $E_{0,M}$ module to obtain the total output port Output1 of the analysis filter part.

Coefficient design is carried out on the above structure, which comprises specific steps as follows.

In first step, an order N and a stopband cutoff frequency $\omega_s$ of a low-pass analysis filter in the 2c-QMFB are determined, wherein N is an even number.

In second step, an original coefficient $H_0 = [h_0(0), h_0(1), \ldots, h_0(N-1)]$ of the low-pass analysis filter is obtained according to design parameters, so as to obtain an odd term coefficient $E_0 = [e_0(0), e_0(1), \ldots, e_0(N/2-1)] = [h_0(0), h_0(2), \ldots, h_0(N-2)]$. Because coefficients of the $H_0$ are even-symmetric, even term coefficients $E_1$ of the $H_0$ are in a reverses sequence of odd term coefficients, so that it is only necessary to carry out subsequent design on the coefficient $E_0$.

In third step, $E_0$ is expressed as a coefficient matrix E of p×q and a retention coefficient vector $E_{0,M}$ with a length of M.

$$E = \begin{bmatrix} e_0(0) & \cdots & e_0((n-1)p) & e_0(n\cdot p + M) & \cdots & e_0((q-1)p + M) \\ e_0(1) & \cdots & e_0((n-1)p+1) & e_0(n\cdot p + M + 1) & \cdots & e_0((q-1)p + M + 1) \\ \vdots & & \vdots & \vdots & & \vdots \\ e_0(p-1) & \cdots & e_0((n-1)p+p-1) & e_0(n\cdot p + M + p - 1) & \cdots & e_0((q-1)p + M + p - 1) \end{bmatrix}; \quad (9)$$

$$E_{0,M} = [e_0(n\cdot p), e_0(n\cdot p + 1), \ldots, e_0(n\cdot p + M - 1)]; \quad (10)$$

In fourth step, SVD decomposition is carried out on the coefficient matrix E to obtain matrices U, S and V. because all elements in the three matrices are decomposed by the coefficient matrix E, all the elements are known values.

In fifth step, a parameter D is set, the first D columns of U1 of the matrix U, a D×Dpart S1 of an upper left corner of the matrix S and the first D columns of V1 of the matrix V are taken to calculate an equivalent coefficient matrix E′ of an original coefficient matrix, and the E is replaced by E′.

$$E' = U1\cdot S1\cdot V1^T; \quad (11)$$

In sixth step, according to the retention coefficient vector $E_{0,M}$ obtained in the second step and the decomposition coefficient matrices U1, S1 and V1 obtained in the fifth step, elements in the vector $E_{0,M}$ are taken as coefficients of the M multipliers in the $E_{0,M}$ module; a $d^{th}$ column of elements in the matrix U1 is taken as coefficients of the multipliers of the $d^{th}$ X module; elements on a diagonal line in the matrix S1 are taken as coefficients of a multiplier $y_{1,1}$, a multiplier $y_{2,2}, \ldots$, a multiplier $y_{D,D}$ in the Y module, and setting coefficients of the remaining multipliers to be 0; and a $d^{th}$ column of elements in the matrix V1 is taken as coefficients of the multipliers of the $d^{th}$ z module.

In the matrix decomposition structure of the two-channel quadrature mirror filter bank provided by the present application, a number Mu of multipliers used and a number Ad of adders are:

$$Mu = 2\cdot[(p+q)\cdot D + D + M - P_0 - P_1]; \quad (7)$$

$$Ad = 2\cdot[(p+q-2)\cdot 2\cdot D + (M-1)\cdot 2 + D + 4 - 2\cdot P_0]; \quad (8)$$

wherein, $P_0$ represents a number of coefficients with a value of 0 in the coefficient matrices U1 and V1 obtained after matrix decomposition, and $P_1$ represents a number of coefficients with a value of 1 in the coefficient matrices U1, S1 and V1 obtained after matrix decomposition. In this structure, the coefficients with the values of 0 and 1 do not need the multipliers, and meanwhile, the coefficients with the value of 0 do not need the adders. Therefore, for a complete 2c-QMFB, compared with the efficient polyphase structure based on time division multiplexing, this structure reduces (N−Mu) multipliers and (2·N−Ad) adders.

In order to verify the effectiveness of the present invention, computer simulation is carried out on the filter bank structure provided by the present invention. Design requirements in the simulation are set first: an order of the low-pass analysis filter is N=80, and a stopband cutoff frequency is $\omega_s=0.55\pi$, p=5, q=6, M=10, D=2.

According to the above method, designed filter coefficients U1, S1, V1 and $E_{0,M}$ are as shown in Table 1, Table 2, Table 3 and Table 4, and an equivalent coefficient $E_0'$ (corresponding to the coefficients U1, S1, V1 and $E_{0,M}$ is as shown in Table 5:

TABLE 1

| X1; | X2; |
| --- | --- |
| −0.606849016502455 | −0.457908930686692 |
| 0.505028011444831 | 0.222770839020308 |
| −0.404986517790401 | 0.0931622434518568 |
| 0.350620998945805 | −0.332193041927060 |
| −0.299552690410775 | 0.788454909154494 |

TABLE 2

| Y1; | Y2; |
| --- | --- |
| 0.0387798319972484 | 0 |
| 0 | 0.00897544900018361 |

TABLE 3

| Z1; | Z2; |
| --- | --- |
| −0.0154867559398562 | 0.0401163341697843 |
| 0.0204137422453275 | 0.0436353844505695 |
| 0.205834108852823 | −0.968320765535314 |
| 0.933788827373398 | 0.154936477092068 |

TABLE 3-continued

| Z1; | Z2; |
|---|---|
| −0.286195028232965 | −0.181425900531012 |
| 0.0557367996758862 | 0.0438276017201872 |

TABLE 4

| h1~h5 | h6~h10 |
|---|---|
| 0.0133401205637964 | 0.457125086115405 |
| −0.0194091878227965 | −0.0960691031974238 |
| 0.0313077209671330 | 0.0552235021482893 |
| −0.0556951149025869 | −0.0386552836407374 |
| 0.142211655087973 | 0.0285970736459192 |

TABLE 5

| $e_0'(0)$~$e_0'(19)$ | $e_0'(20)$~$e_0'(39)$ |
|---|---|
| 0.000199581959521899 | 0.457125086115405 |
| −0.000223095250012948 | −0.0960691031974238 |
| 0.000276768483399345 | 0.0552235021482893 |
| −0.000330183911501867 | −0.0386552836407374 |
| 0.000463796234987985 | 0.0285970736459192 |
| −0.000659745598272711 | −0.0226121014382901 |
| 0.000487048698007320 | 0.0185979527229001 |
| −0.000284117403492383 | −0.0145358884942809 |
| 0.000147463667668297 | 0.0122347928023460 |
| 7.16577924797876e−05 | −0.00975100942818865 |
| −0.000864259042663877 | 0.00748082077795672 |
| 0.00209511405527004 | −0.00596785675761321 |
| −0.00404237195263048 | 0.00434307795416324 |
| 0.00568585868164364 | −0.00335046435950436 |
| −0.00924364434904498 | 0.00204071067448651 |
| 0.0133401205637964 | −0.00149181087413173 |
| −0.0194091878227965 | 0.00117923162860241 |
| 0.0313077209671330 | −0.000838716212656116 |
| −0.0556951149025869 | 0.000627178995811300 |
| 0.142211655087973 | −0.000337315871705311 |

According to the obtained equivalent coefficient, a stopband attenuation AS of the filter bank is calculated:

$$AS = 20\log_{10}\left(\max_{\omega_s \leq \omega \leq 1} |H_0(\omega)|\right); \quad (12)$$

wherein, $|H_0(\omega)|$ is the amplitude response of the low-pass analysis filter obtained, $\omega_s$ is the stop-band cutoff frequency of the low-pass analysis filter obtained, a calculation result is compared with the stopband attenuation of the efficient polyphase structure based on time division multiplexing, and results are as shown in Table 6:

TABLE 6

| Design structure | Prototype filter length | Stopband attenuation AS/dB | Number of adders | Number of multipliers |
|---|---|---|---|---|
| Efficient polyphase structure | 80 | −46.21 | 160 | 80 |
| This method | 80 | −45.42 | 120 | 68 |

Figure 4:
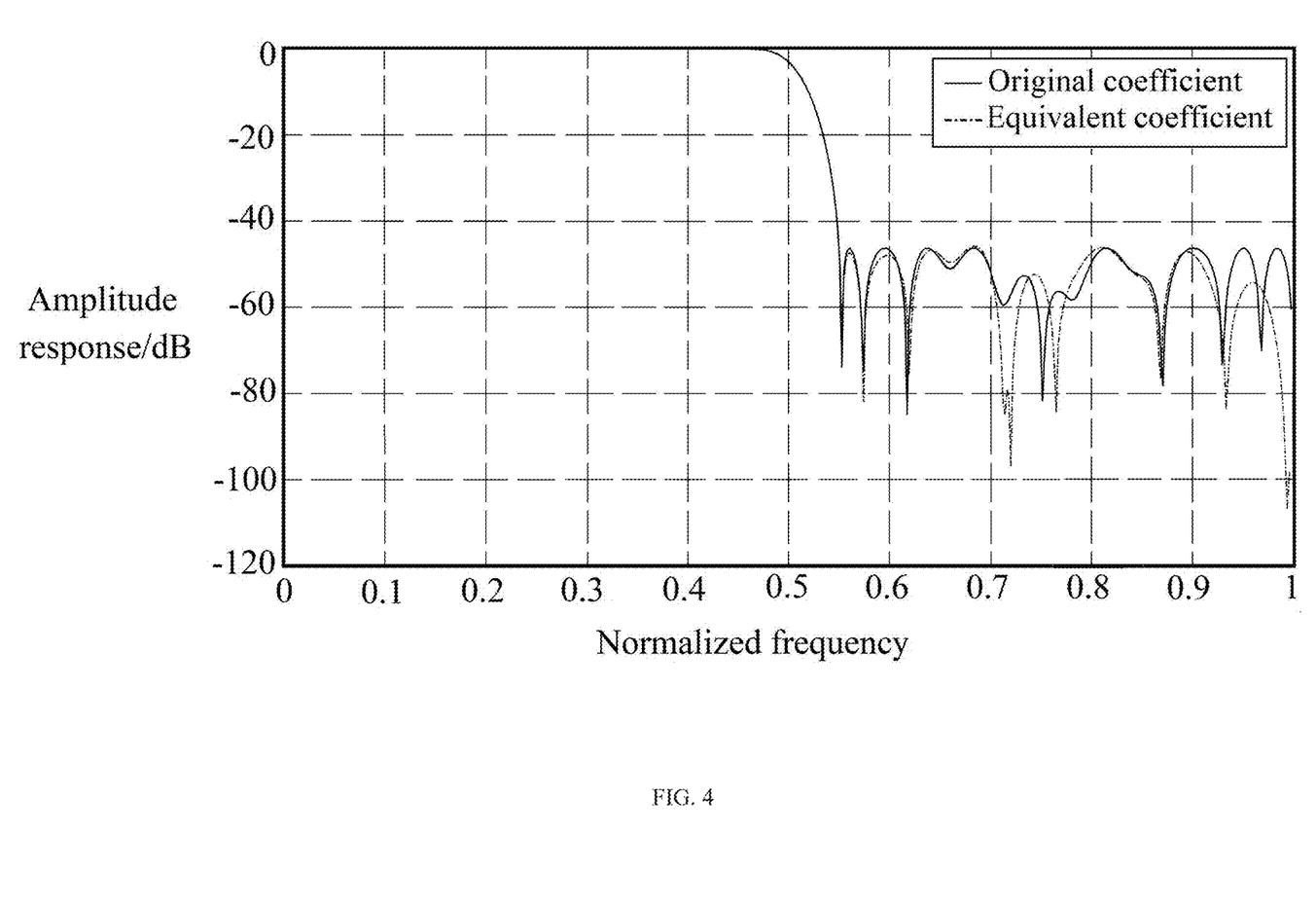
FIG. 4 is an amplitude frequency response diagram before and after coefficient decomposition of a low-pass analysis filter in the embodiment.

An amplitude frequency response diagram of the low-pass analysis filter before and after coefficient decomposition is drawn by using the prototype filter coefficient and the equivalent coefficient, as shown in FIG. 3. It can be seen from Table 6 and FIG. 4 that this method can save (80−68)/80=15% multipliers and (160−120)/160=25% adders on the premise of basically not affecting the frequency domain performance of the filter bank, thus effectively reducing hardware resource consumption.

Figure 5:
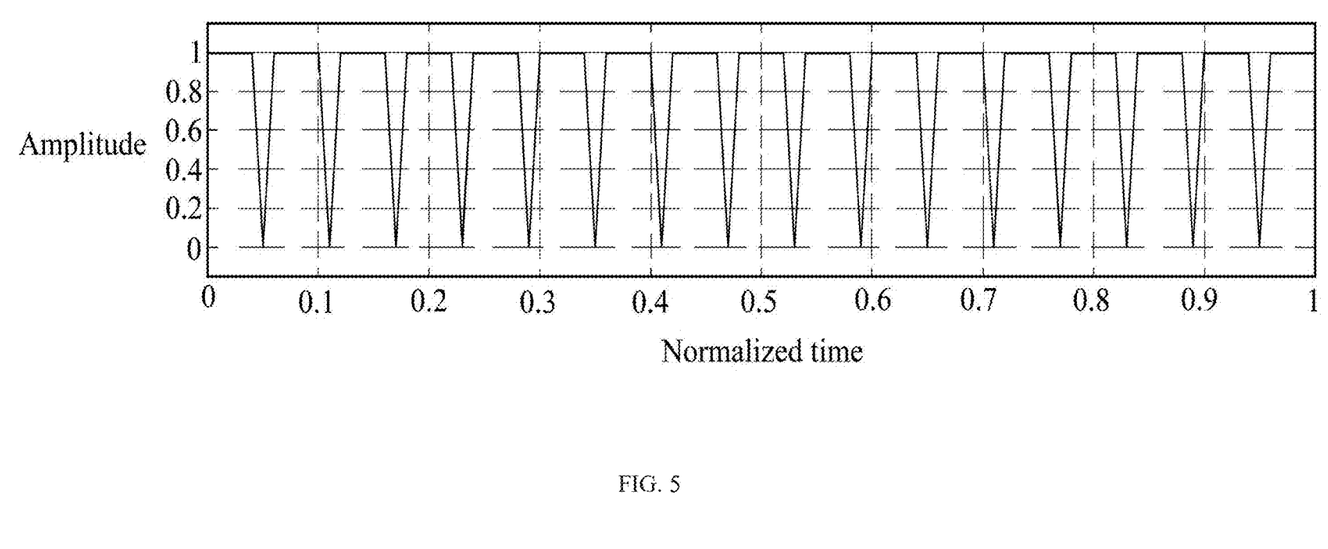
FIG. 5 is an input signal diagram of the two-channel quadrature mirror filter bank in the embodiment.
Figure 6:
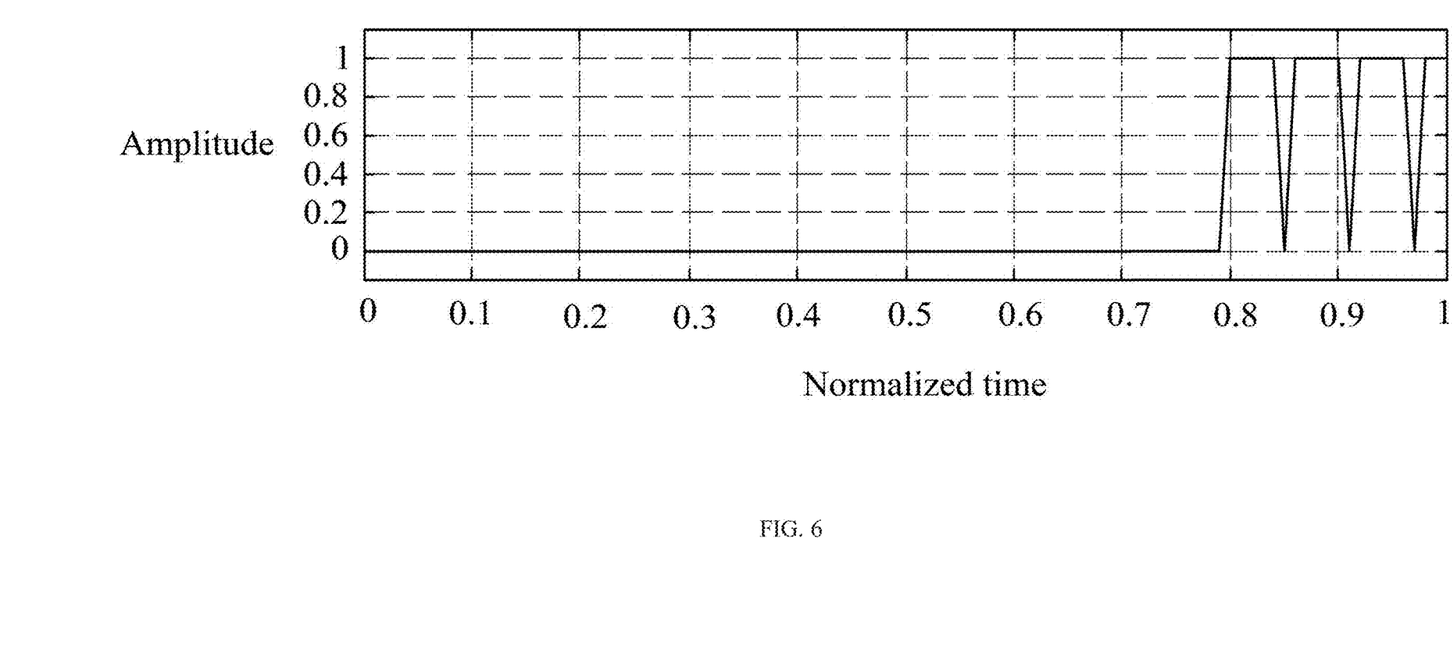
FIG. 6 is an output signal diagram of the two-channel quadrature mirror filter bank in the embodiment.

Finally, the filter bank structure provided by this method is modeled on Simulink for simulation. As shown in FIG. 5, a rectangular wave signal is input for verification. As shown in FIG. 6, an output signal obtained after the input rectangular wave signal passes through the filter bank basically has no amplitude distortion, which shows the correctness of this method. Simulation results show that the structure provided by this method is functionally consistent with the two-channel quadrature mirror filter bank realized by the conventional structure, and the frequency domain performance and the signal reconstruction performance both are within the design requirements, which proves the effectiveness of this method.

The coefficient design method of a matrix decomposition structure of a two-channel quadrature mirror filter bank is processed by a coefficient design equipment of the matrix decomposition structure of the two-channel quadrature mirror filter bank.

Figure 7:
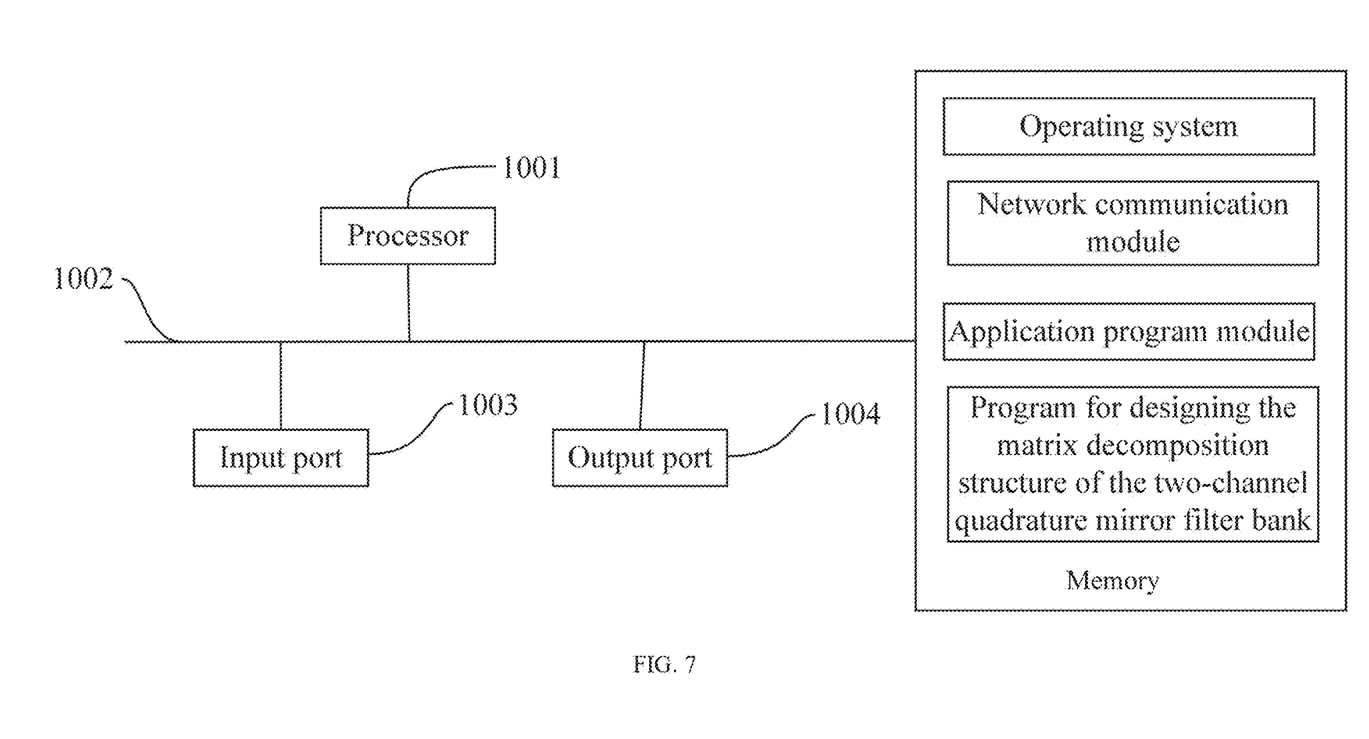
FIG. 7 is a diagram of a coefficient design equipment of the matrix decomposition structure of the two-channel quadrature mirror filter bank.

As shown in FIG. 10, the coefficient design equipment of the matrix decomposition structure of the two-channel quadrature mirror filter bank includes: a processor 1001 (such as Central Processing Unit, CPU), a communication bus 1002, an input port 1003, an output port 1004, and a memory 1005. Among them, the communication bus 1002 is used to achieve connection communication between these components; the input port 1003 is used for data input; and the output port 1004 is used for data output, and the memory 1005 can be high-speed RAM memory or non volatile memory, such as disk memory, non-transitory computer-readable storage medium. Optionally, memory 1005 is a storage device independent of the aforementioned processor 1001.

The memory 1005, as a non-volatile readable storage medium, may include an operating system, network communication module, application program module, and a program for designing the matrix decomposition structure of the two-channel quadrature mirror filter bank. The network communication module is mainly used to connect to servers and communicate data with them; And processor 1001 is used to call the program to process the method stored in memory 1005, and execute all steps of the coefficient design method of the matrix decomposition structure of the two-channel quadrature mirror filter bank mentioned above.

The above are only some embodiments of the present disclosure, and neither the words nor the drawings can limit the protection scope of the present disclosure. Any equivalent structural transformation made by using the contents of the specification and the drawings of the present disclosure under the overall concept of the present disclosure, or directly/indirectly applied in other related technical fields are included in the protection scope of the present disclosure.

We claim:

1. A matrix decomposition structure of a two-channel quadrature mirror filter bank, comprising an analysis filter part, a synthesis filter part and a connecting part, wherein the analysis filter part and the synthesis filter part have a same structure, and the analysis filter part comprises one $E_{0,M}$ module, D X modules, one Y module, D Z modules, a total input port Input, and total outputs Output0 and Output1;

a $d^{th}$ X module $X_d$ comprises p multipliers, 2·(p−1) adders and 2·(p−1) delayers, d=1, 2, . . . D; an input port of the multiplier is connected with the total input port Input;

at a first time point, outputs of the p multipliers are delayed and added in a sequence from back to front to obtain an output $I_{d,0}$; and at a next time point, the outputs of the p multipliers are delayed and added in a sequence from front to back to obtain an output $I_{d,1}$;

the Y module comprises $D^2$ multipliers and D adders; a multiplier $y_{d,1}$, a multiplier $y_{d,2}$, ..., a multiplier $y_{d,D}$ take the $I_{d,0}$ as an input at the first time point, and take the $I_{d,1}$ as an input at the next time point; and outputs of a multiplier $y_{1,d}$, a multiplier $y_{2,d}$ ... a multiplier $y_{D,d}$ pass through one adder to obtain an output $J_d$;

structures of the Z module and the $E_{0,M}$ module are the same as that of the X module, and a $d^{th}$ Z module takes the output $J_d$ of the Y module as the input of the multiplier; and the Input port of the multiplier in the $E_{0,M}$ module is connected with the total input port Input through the delayer, so that an output $O_0$ is obtained at the first time point; and an output $O_1$ is obtained at the next time point; and at the first time point, outputs of the D Z modules are added with the output $O_0$ of the $E_{0,M}$ module, and output from the total output port Output0 of the analysis filter part, and the Output1 remains unchanged; and at the next time point, the outputs of the D Z modules are added with the output $O_1$ of the $E_{0,M}$ module, and output from the total output port Output1 of the analysis filter part, and the Output0 remains unchanged.

2. The matrix decomposition structure of the two-channel quadrature mirror filter bank according to claim 1, wherein the connecting part comprises a plurality of adders, the connecting part adds and subtracts the Output0 and the Output1 output by the analysis filter part respectively at the first time point, and at the first time point, a subtraction result is subtracted from an addition result to input into the synthesis filter part; at the next time point, the addition result is added with the subtraction result to input into the synthesis filter part; and calculations at the first time point and the next time point are carried out continuously alternately.

3. The matrix decomposition structure of the two-channel quadrature mirror filter bank according to claim 1, wherein, in the X module, a delay of the delayer is $t=2 \cdot T$, and T is a system clock period; at the first time point, an output of a $p^{th}$ multiplier $X_{d,p}$ is subjected to 1 delay t, and then added with an output of a $(p-1)^{th}$ multiplier $x_{d,p-1}$, then a calculation result is subjected to 1 delay t, and then added with an output of a $(p-2)^{th}$ multiplier $x_{d,p-2}$, and so on, so that the output of $$T1 = \frac{N - 2 \cdot M}{2} T,$$

T is a system clock period, and N represents a number of coefficients of a low-pass filter in the analysis filter part; at the first time point, an output of an $M^{th}$ multiplier $h_M$ is delayed and added for M−1 times to obtain the output $O_0$ of the $E_{0,M}$ module; and at the next time point, an output of a $1^{st}$ multiplier $h_1$ is delayed and added for M−1 times to obtain the output $O_1$ of the $E_{0,M}$ module.

5. The matrix decomposition structure of the two-channel quadrature mirror filter bank according to claim 4, wherein one Z module comprises q multipliers, $2 \cdot (q-1)$ adders, $2 \cdot (q-2)$ delayers with a delay of t1 and 1 delayer with a delay of t2, wherein $t1 = p \cdot t$, and $t2 = M \cdot t + t1$; at the first time point, an output of a $q^{th}$ multiplier $Z_{d,q}$ is delayed and added for q−1 times to obtain the output $K_{d,0}$ of the $Z_d$, wherein a delay of an $n^{th}$ delayer is t2, delays of the remaining delayers are all t1, and n satisfies $$\frac{N - 2 \cdot M}{4} = p \cdot n \text{ and } \frac{N}{2} = p \cdot q + M;$$

and at the next time point, an output of a $1^{st}$ multiplier $Z_{d,1}$ is delayed and added for q−1 times to obtain the output $K_{d,1}$ of the $Z_d$, wherein the delay of the $n^{th}$ delayer is t2, and the delays of the remaining delayers are all t1.

6. A coefficient design method of a matrix decomposition structure of a two-channel quadrature mirror filter bank, wherein the method carries out coefficient design for the matrix decomposition structure of the two-channel quadrature mirror filter bank according to claim 1, and comprises specific steps as follows:

first step: determining an order N and a stopband cutoff frequency $\omega_s$ of a low-pass analysis filter in the two-channel quadrature mirror filter bank;

second step: obtaining an original coefficient $H_0$ and an odd term coefficient $E_0$ of the low-pass analysis filter according to design parameters;

third step: expressing $E_0$ as a coefficient matrix E with a size of p×q and a retention coefficient vector $E_{0,M}$ with a length of M:

$$E = \begin{bmatrix} e_0(0) & \cdots & e_0((n-1)p) & e_0(n \cdot p + M) & \cdots & e_0((q-1)p + M) \\ e_0(1) & \cdots & e_0((n-1)p + 1) & e_0(n \cdot p + M + 1) & \cdots & e_0((q-1)p + M + 1) \\ \vdots & & \vdots & \vdots & & \vdots \\ e_0(p-1) & \cdots & e_0((n-1)p + p - 1) & e_0(n \cdot p + M + p - 1) & \cdots & e_0((q-1) \cdot p + M + p - 1) \end{bmatrix};$$

$$E_{0,M} = [e_0(n \cdot p), e_0(n \cdot p + 1), \ldots, e_0(n \cdot p + M - 1)];$$

the $p^{th}$ multiplier $x_{d,p}$ is delayed and added for p−1 times to obtain the output $I_{d,0}$ of the $X_d$; and at the next time point, an output of a $1^{st}$ multiplier $x_{d,1}$ is delayed and added for p−1 times to obtain the output $I_{d,1}$ of the $X_d$.

4. The matrix decomposition structure of the two-channel quadrature mirror filter bank according to claim 1, wherein the $E_{0,M}$ module is a retention coefficient module, and comprises M multipliers, $2 \cdot (M-1)$ adders and $2 \cdot (M-1)$ delayers with a delay of t, input ports of the M multipliers are connected with the total input port Input through a delayer with a delay of T1, fourth step: carrying out SVD decomposition on the coefficient matrix E to obtain matrices U, S and V, $E = USV^T$;

fifth step: taking the first D columns of U1 of the matrix U, a D×D part of an upper left corner of the matrix S and the first D columns of V1 of the matrix V to calculate an equivalent coefficient matrix E' of an original coefficient matrix:

$E' = U1 \cdot S1 \cdot V1^T$; and sixth step: setting coefficients of the M multipliers in the $E_{0,M}$ module to be elements in the vector $E_{0,M}$; setting a $d^{th}$ column of elements in the matrix U1 as coefficients of the multipliers of the $d^{th}$ X module; setting coefficients of the multiplier $y_{1,1}$, the multiplier $y_{2,2}$, ..., the multiplier $y_{D,D}$ in the Y module to be elements on a diagonal line in the matrix S1, and setting coefficients of the remaining multipliers to be 0; and setting a $d^{th}$ column of elements in the matrix V1 as coefficients of the multipliers of the $d^{th}$ Z module, and completing coefficient design for the two-channel quadrature mirror filter bank.

7. The coefficient design method of the matrix decomposition structure of the two-channel quadrature mirror filter bank according to claim 6, wherein the original coefficient of the low-pass analysis filter is $H_0=[h_0(0), h_0(1), \ldots, h_0(N-1)]$, and the odd term coefficient is $E_0=[e_0(0), e_0(1), \ldots, e_0(N/2-1)]=[h_0(0), h_0(2), \ldots, h_0(N-2)]$.

8. The coefficient design method of the matrix decomposition structure of the two-channel quadrature mirror filter bank according to claim 6, wherein:

$$U = [X_1 \ X_2 \ \cdots \ X_p] = \begin{bmatrix} x_{1,1} & x_{2,1} & \cdots & x_{p,1} \\ x_{1,2} & x_{2,2} & \cdots & x_{p,2} \\ \cdots \\ x_{1,p} & x_{2,p} & \cdots & x_{p,p} \end{bmatrix};$$

$$U1 = [X_1 \ X_2 \ \cdots \ Y_D] = \begin{bmatrix} x_{1,1} & x_{2,1} & \cdots & x_{D,1} \\ x_{1,2} & x_{2,2} & \cdots & x_{D,2} \\ \cdots \\ x_{1,p} & x_{2,p} & \cdots & x_{D,p} \end{bmatrix};$$

$$S = [Y_1 \ Y_2 \ \cdots \ Y_p]^T = \begin{bmatrix} y_{1,1} & 0 & \cdots & 0 \\ 0 & y_{2,2} & \cdots & 0 \\ \cdots \\ 0 & 0 & \cdots & y_{p,q} \end{bmatrix};$$

-continued $$S_1 = [Y_1 \ Y_2 \ \cdots \ Y_D]^T = \begin{bmatrix} y_{1,1} & 0 & \cdots & 0 \\ 0 & y_{2,2} & \cdots & 0 \\ \cdots \\ 0 & 0 & \cdots & y_{D,D} \end{bmatrix};$$

$$V = [Z_1 \ Z_2 \ \cdots \ Z_q] = \begin{bmatrix} z_{1,1} & z_{2,1} & \cdots & z_{q,1} \\ z_{1,2} & z_{2,2} & \cdots & z_{q,2} \\ \cdots \\ z_{1,q} & z_{2,q} & \cdots & z_{q,q} \end{bmatrix}; \text{ and}$$

$$V = [Z_1 \ Z_2 \ \cdots \ Z_D] = \begin{bmatrix} z_{1,1} & z_{2,1} & \cdots & z_{D,1} \\ z_{1,2} & z_{2,2} & \cdots & z_{D,2} \\ \cdots \\ z_{1,q} & z_{2,q} & \cdots & z_{D,q} \end{bmatrix}.$$

9. The coefficient design method of the matrix decomposition structure of the two-channel quadrature mirror filter bank according to claim 8, wherein, in the matrix decomposition structure of the two-channel quadrature mirror filter bank, a number Mu of multipliers and a number Ad of adders are:

$Mu=2\cdot[(p+q)\cdot D+D+M-P_0-P_1]$; and $Ad=2\cdot[(p+q-2)\cdot 2\cdot D+(M-1)\cdot 2+D+4-2\cdot P_0]$, wherein, $P_0$ represents a number of coefficients with a value of 0 in the matrices U1 and V1, and $P_1$ represents a number of coefficients with a value of 1 in the coefficient matrices U1, S1 and V1, and in an actual hardware circuit, multipliers with coefficients of 0 and 1 and adders with a coefficient of 0 are omitted.

\* \* \* \* \*